United States Patent [19]
Kitayama et al.

[11] Patent Number: 5,622,639
[45] Date of Patent: Apr. 22, 1997

[54] HEAT TREATING APPARATUS

[75] Inventors: Hirofumi Kitayama, Aiko-gun; Toshimitu Shibata, Yokohama; Toshiaki Miyaju, Tsukui-gun; Katsushin Miyagi, Sagamihara, all of Japan

[73] Assignees: Tokyo Electron Kabushiki Kaisha, Tokyo-to; Tokyo Electron Tohoku Kabushiki Kaisha, both of Japan

[21] Appl. No.: 280,855

[22] Filed: Jul. 26, 1994

[30] Foreign Application Priority Data

| Jul. 29, 1993 | [JP] | Japan | 5-207068 |
| Jul. 30, 1993 | [JP] | Japan | 5-208216 |
| Apr. 11, 1994 | [JP] | Japan | 6-098129 |

[51] Int. Cl.$^6$ .................................................. F27B 5/14
[52] U.S. Cl. .................................. 219/390; 219/400
[58] Field of Search ............................ 219/385, 390, 219/395, 398, 400

[56] References Cited

U.S. PATENT DOCUMENTS

| 4,937,434 | 6/1990 | Nakao | 219/390 |
| 5,229,576 | 7/1993 | Nakao et al. | 219/390 |

FOREIGN PATENT DOCUMENTS

| 4-119435 | 5/1992 | Japan . |
| 4-113436 | 5/1992 | Japan . |

*Primary Examiner*—Tu Hoang
*Attorney, Agent, or Firm*—Beveridge, Degrandi, Weilacher & Young, L.L.P.

[57] ABSTRACT

A heat treating apparatus for mounting objects to be treated on an object-to-be-treated boat (wafer boat) provided on a heat insulating cylinder, and loading the object-to-be-treated boat into a processing vessel for a heat treatment, a temperature detecting sensor is provided in a film depositing area of a relatively large heat capacity, which is a lower part of a gap defined between an inner tube of the processing vessel and an outer tube thereof so as to detect temperatures of those of the objects to be treated located there and control temperatures of the heating unit. Thus heat response is improved, and temperatures of the objects to be treated can be accurately detected.

19 Claims, 5 Drawing Sheets

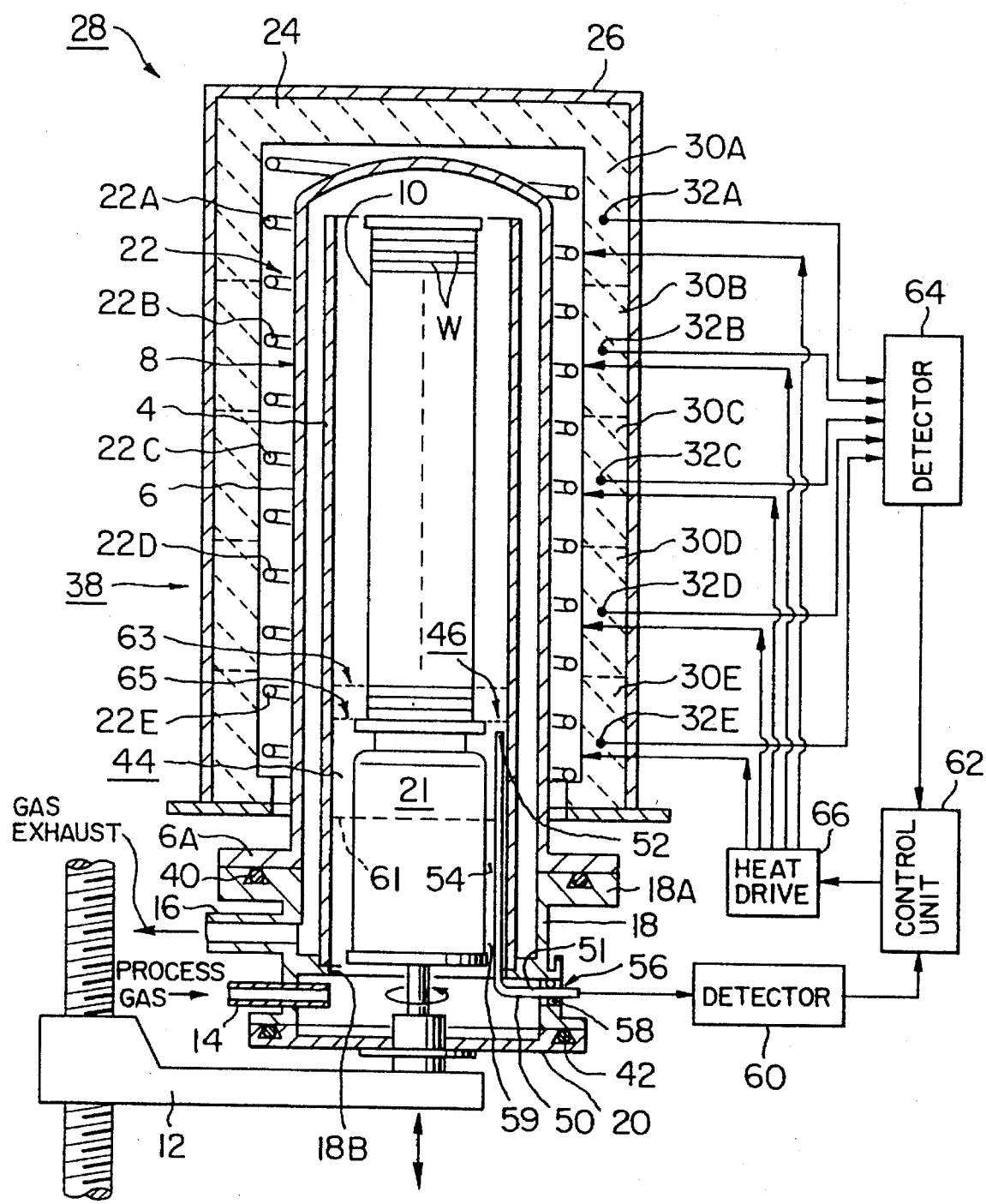
F I G. 1

HEAT TREATING APPARATUS

BACKGROUND OF THE INVENTION

The present invention relates to a heat treating apparatus for heat treating objects to be processed, such as semiconductor wafers.

Heat treating apparatuses are generally used in subjecting objects to be processed to a required heat treatment in a soaked state to form thin films on the surfaces of the objects to be treated.

The conventional heat treating apparatus of this type will be explained with reference to FIG. 7. The heat treating apparatus 2 comprises an inner tube 4 of quartz, and an outer tube 6 disposed conically with the inner tube 4 and having a larger outer diameter than the inner tube 4. A plurality of sheets of semiconductor wafers W as objects to be treated are loaded into and unloaded out of the processing vessel, horizontally mounted at a vertical interval on a wafer boat 10 of quartz which is moved up and down by an elevator 12.

A stainless steel manifold 18 is connected to the underside of the processing vessel 8 having a processing gas feed pipe 14 and an exhaust pipe 16. A stainless steel cap 20 is connected to the opening in the bottom of the manifold 8 and is capable of air-tightly closing the bottom opening. The wafer boat 10 is mounted on the cap 20 through a heat insulating cylinder 21 of quartz.

A heating unit 22 is wound longitudinally on the exterior of the circumferential wall of the processing vessel 8 for heating the processing vessel 8. The exterior of the heating unit 22 is covered with a stainless steel outer shell 26 through a heat insulating material 24.

Temperature control in the heat treatment of semiconductor wafers W is a very important factor. Accordingly for precise temperature control, a heating zone is transversely divided into a plurality of zones, e.g., five zones of a first to a fifth heating zones 32A–32E. Temperature sensors, e.g., outer thermocouples 30A–30E are provided in the heating unit 22 corresponding to the respective heating zones 30A–30E. Based on detected values of the temperature sensors, electric power of the heating unit 22 can be controlled for the respective heating zones 30A–30E.

Because of some distance between the wafers W and the heating unit 22, it is difficult for the outer thermocouples 32A–32E of the heater to detect correct temperatures. To compensate for their incorrect detection to some extent, an L-shaped thermocouple tube 34 of quartz is provided between the inner and the outer tube 5 and removably supported by the manifold 18. A plurality of inner thermocouples 36A–36E are provided in the thermocouple tube 34 corresponding to the heating zones 30A–30E.

In heat-treating wafers W in such heat treating apparatus, when the wafer boat 10 of the room temperature with a plurality of wafers W mounted on is loaded into the processing vessel 8 heated up to about 400° C., the temperature in the heating furnace lowers. But power of the heating unit 22 is increased to raise the furnace internal temperature to a processing temperature, e.g., 850° C. A period of time necessary to increase and stabilize temperatures is relatively short because of relatively small heat capacities from the top (TOP) zone of the wafer boat 10 to the vicinity of the bottom zone (BTM) thereof, specifically from the uppermost heating zone 30A to the heating zone 30D immediately upper of the lowermost heating zone, and is relatively easy to control.

But the BTM zone, specifically the lowermost heating zone 30E needs a relatively long period of time to increase and stabilize temperatures because the heat insulating cylinder 21 as a heat insulating material has a large heat capacity, and heat release from the heating furnace opening is large.

To shorten a period of time necessary for the temperature stabilization, a temperature control makes a temperature increase rate of the heating zones as high as possible, and stabilizes a temperature without occurrences of overshoots, etc. To this end, not only temperatures of the internal thermocouples 32A–32E of the heating unit 22 but also temperatures of the internal thermocouples 36A–36E in the heating furnace are monitored to control a temperature of the heating unit 22, based on detected values of the external thermocouples 32A–32E or of the internal thermocouples 36A–36E so that the internal thermocouples 36A–36E have a set temperature.

But in the above-described heat treating apparatus, the internal thermocouples 36A–36E are provided between the inner tube 4 and the outer tube 6 for the temperature compensation. But the internal thermocouples 36A–36E are not sufficiently near each other, and the temperature response of the internal thermocouples is not sufficient. Especially the bottom zone having a large heat capacity because of the heat insulating cylinder 21 has inferior temperature response, and it is a problem that it takes a long time before all the wafers W have a stabilized temperature.

In a heat treatment, e.g., depositing a film processing gas introduced through the processing gas feed pipe 14 ascends in the inner tube 4, reaction products are deposited on the surfaces of the wafers W, and used processing gas descends between the inner tube 4 and the outer tube 6 to be discharged through the exhaust pipe 16. But because of the thermocouple tube 34 accommodating the internal thermocouples 36A–36E disposed downstream of the processing gas flow, excess substances after the reaction, e.g., ammonium chloride as a byproduct of dichlorosilane and ammonium in deposition of silicon nitride, lower quality silicon films in deposition of silicon films using silane, and low-quality silicon oxide films in deposition of silicon oxide using TEOS, stay around the thermocouple tube 34 and the connections of the thermocouple tube to the manifold. When the internal thermocouples are dismounted for maintenance, troubles take place; the thermocouple tube is damaged. Washing off the depositions on the thermocouple tube is hard work. The depositions on the thermocouple tube cause thermal troubles, which makes it more difficult to measure correct temperatures of the wafers.

A plurality of thermocouples, e.g., 5 thermocouples have to be used. Wires connected to the internal thermocouples have to be accordingly long, and cost increases are unavoidable.

SUMMARY OF THE INVENTION

In view of the above-described problems, the present invention was made to effectively solve the problems. An object of the present invention is to provide a heat treating apparatus including a temperature detecting sensor only at a position where the temperature detecting sensor is near objects to be treated and where heat responses can be quickly received, and the mount portion of the sensor is positioned in a film non-depositing area below a film depositing area, whereby heat response is improved, and maintenance is facilitated.

To solve the above-described problems, the present invention relates to a heat treating apparatus for loading objectsto-be-treated into a processing vessel on an object-to-be-treated boat mounted on a heat insulating cylinder, and heating, for a heat treatment, the objects to be treated by a heating zone divided into a plurality of zones, the apparatus comprising a temperature detecting sensor for controlling a heating temperature disposed in a lower part of an interior of the processing vessel which has a relatively large heat capacity and which is a film depositing area where films stay in the heat treatment.

In the present invention having the above-described structure, the temperature detecting sensor is provided in the film depositing area formed, e.g., between the heat insulating cylinder and the inner tube. Accordingly temperatures of a part which is a heat controlled area can be measured with good heat response and more accurately and quickly. Consequently all objects to be treated can be quickly heated up to a processing temperature and stabilized at the temperature. In addition, throughputs can be further improved.

BRIEF DESCRIPTION OF THE DRAWINGS

FIG. 1 is a vertical sectional view of the heat treating apparatus according to a first embodiment of the present invention.

DETAILED DESCRIPTION OF PREFERRED EMBODIMENTS

First Embodiment

The heat treating apparatus according to a first embodiment of the present invention will be explained with reference to the drawings attached hereto.

Figure 7:
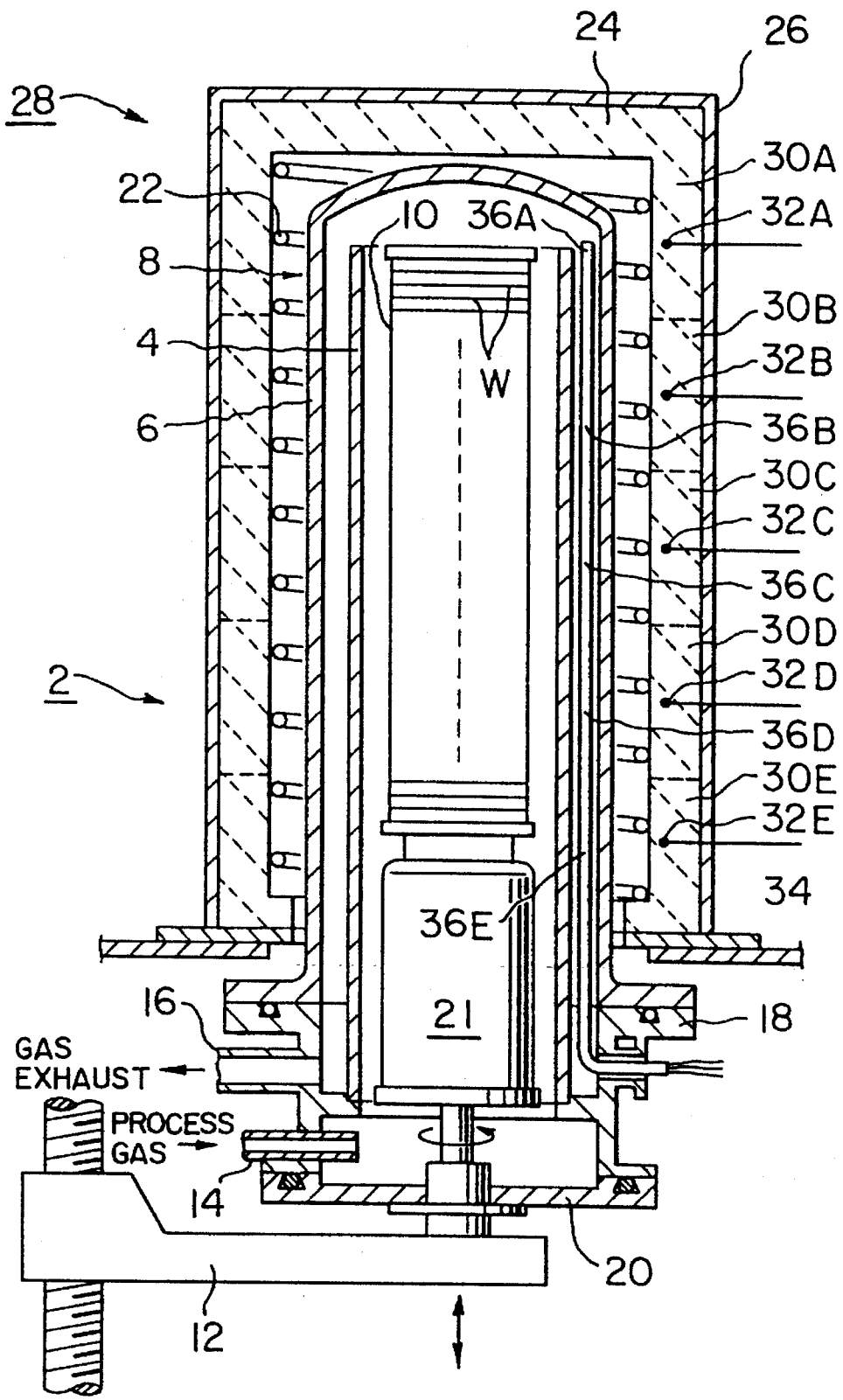
FIG. 7 is a vertical sectional view of a conventional heat treating apparatus.

FIG. 1 is a vertical sectional view of the heat treating apparatus according to the first embodiment of the present invention. Common members of the first embodiment with the prior art apparatus of FIG. 7 are represented by common reference numerals.

As in FIG. 1, the heat treating apparatus 38 according to the first embodiment comprises a processing vessel (processing chamber) 8 formed of, e.g., quartz, and in the shape of a cylinder, and having the upper end closed and the lower end opened. The processing vessel 8 comprises an outer tube 6 of quartz having the upper end closed, and an inner cylindrical tube 4 of quartz having a smaller diameter than the outer tube 6, disposed inside the outer tube 6 conically therewith and having, e.g., the upper end opened. Inside the inner tube 4 a plurality of objects to be treated, e.g., semiconductor wafers W are removably mounted horizontally at a certain interval on an object-to-be-treated boat (wafer boat) of, e.g., quartz. A radial gap between the outer tube 6 and the inner tube 4, and a gap between the inner tube 4 and the wafer boat 10 are set respectively at about 20 mm.

A heating unit 22 is wound helically on the outer circumference of the treating vessel 8 and conically surrounds the processing vessel 8. On the outer circumference of the heating unit 22 there is provided a cylindrical outer shell 26 of, e.g., stainless steel through a heat insulating material 24. Thus a heating furnace 28 is formed.

A heating zone of the heating furnace 28 is divided latitudinally of the processing vessel 8 in a plurality of heating zones, e.g., first to fifth heating zones 30A–30E for precise temperature control. Temperature sensors, e.g., outer thermocouples 32A–32E are provided in the heating unit 22 corresponding to the respective heating zones 30A–30E. Based on detected values of the outer thermocouples 32A–32E, power of each heating zone 30A–30E can be individually controlled. The heating unit 22 is accordingly divided into five heating units (22A–22E) corresponding to the heating zones.

A cylindrical manifold 18 of, e.g., stainless steel, is connected to the lower end of the processing vessel 8. An annular flange 18A is formed on the upper end of the manifold 18, and the flange 18A air-tightly bears a lower end flange 6A of the outer tube 6 through, e.g., an O-ring 40.

The manifold 18 bears the lower end of the inner tube 4 on an inward projection 18B. A processing gas feed pipe 14 for introducing a processing gas is connected to the manifold 18 with the forward end extended inside the inner tube 4. A gas exhaust pipe 16 connected to a vacuum pump (not shown) is connected to the manifold 18 in communication with the gap between the outer tube 6 and the inner tube 4.

The wafer boat 10 is mounted on a heat insulating cylinder 21 of, e.g., quartz, which is heat insulating. The heat insulating cylinder 21 is rotatably supported by a cap 20 of, e.g., stainless steel, which air-tightly seals a lower end opening of the manifold 10 through an O-ring 42. The cap 20 is supported movably up and down by, e.g., an elevator 12 to load and unload the wafer boat 10 into and out of the inner tube 4.

A temperature detecting sensor 46 for temperature control is provided on a lower part of the interior of the processing vessel 8 having a relatively larger heat capacity than the rest of the vessel 8 and in a film depositing area 44 where an intended film of a heat treatment is deposited. The temperature detecting sensor 46 comprises a sensor L-shaped glass tube 50 of an about 9 mm-diameter, and one bottom thermocouple 52 housed in the glass tube 50. The thermocouple 52 is positioned in the film depositing area 44, where an intended film is deposited. The glass tube 50 is positioned in the gap 54 between the inside surface of the inner tube 4 and the outside surface of the heat insulating cylinder 21, and a mount portion 51 of the glass tube 50, the proximal end thereof, is passed, supported through a through-hole 56 in the manifold 10 air-tightly through, e.g., an O-ring 58. The through-hole 56 is formed below the film depositing area 44 and in a film non-depositing area 59 where no reaction by-products stay.

The bottom thermocouple 52 is substantial horizontally opposed to the outer thermocouple 32E for the lowermost heating zone 30E of the bottom zone. This position is optimum. The film non-depositing area 59 in a lower part of the interior of the reaction vessel 8 varies depending on kinds of film depositing steps, treating temperatures even for the same film depositing step, and shapes of the heat insulating cylinder 21, and is generally a part of the gap below substantially $2/3$ a height of the heat insulating cylinder 21. In many cases, a film deposition border line 61, which is a border line between the film non-depositing area 59, where no reaction by-products, etc. are formed, and the film depositing area 44, where an intended reaction product is formed is located substantially ⅔ a height of the heat insulating cylinder 21.

As described above, the film depositing border line 61, which is a border line between the film non-depositing area 59 and the film depositing area 44, is generally positioned substantially ⅔ a height of the heat insulating cylinder 21. The bottom thermocouple 52 of the heat detecting sensor 46 is located in an area between this film depositing border line 61, and the top of the lowermost heating zone 30E, e.g., the same horizontal level 63 as one of the wafers W mounted on the wafer 10 which is upper of the lowest one by some sheets, e.g., three sheets, preferably an area between the film depositing border line 61 and the same horizontal level 65 as the lower end of the wafer boat 10. Because the film depositing border line 61 varies, as described above, depending on processing steps, processing temperatures, shapes of the heat insulating cylinder 21, etc., the sensor glass tube 50 is mounted on the manifold 18 so that the bottom thermocouple 52 is located in accordance with such variation in conditions but in the film depositing area 44.

When the bottom thermocouple 52 is located upper of the horizontal level 63, the bottom thermocouple 52 is in an area of a smaller heat capacity, and cannot correctly detect temperatures at the bottom of the interior of the processing vessel where temperature control is relatively difficult because of its large heat capacity.

In the bottom thermocouple 52 a temperature is detected by a bottom detector 60, and an output of the bottom detector 60 is supplied to a control unit 62. Temperatures of respective outer thermocouples 32A–32E disposed in the heating unit 22 are detected by an outer thermocouple detector 64, and outputs of the outer thermocouple detector 64 are supplied to the control unit 62. Based on the input values, the control unit 62 conducts the individual divided heaters 22A–22E in accordance with various control methods.

The inner thermocouples used in the apparatus of FIG. 7 are omitted above the bottom zone. This is because the area above the bottom zone has a relatively smaller heat capacity than the area with the bottom thermocouple 52 disposed in, and heat response there is accordingly good. Correct temperature control can be conducted even without the use of inner thermocouples. It is possible to dispose additional thermocouples in the gap between the outer tube 6 of the processing vessel 8, and the inner tube 4.

Then temperature control by the heat treating apparatus having the above-described structure according to the first embodiment will be explained.

As shown in FIG. 1, the heating zones upper of the lowest heating zones exclusive of the lowest heating zone 30E has small temperature changes because heat release is little when the heating furnace is opened, and objects to be treated and the wafer boat holding the objects to be treated are loaded through the lower zones while being heated, and in addition, the objects to be treated have a small heat capacity. These zones take a short period of time to have a stabilized temperature. The temperature control is conducted only by the use of the respective outer thermocouples 32A–32D.

The lowest heating zone 30E accommodates the heat insulating cylinder 21 when objects to be treated are loaded, and has a relatively large heat capacity. Heat response there is not good. Accordingly both the outer thermocouple 32E and the bottom thermocouple 52 are used for subtle temperature control.

Taking the temperature characteristic in the heating furnace into consideration, it is unavoidable that a temperature difference of, e.g., about 5° C. occurs between a temperature of the heating unit 22 and the vicinity of the wafers. As a countermeasure to this, before an actual heat treatment a plurality of test thermocouples such as the inner thermocouples in FIG. 7 are inserted inbetween the wafer boat 10 and the inner tube 4 from below to obtain temperature differences between the respective test thermocouples and their corresponding outer thermocouples and prepare a temperature profile. The temperature differences are inputted to the control unit 62 as correction values.

Figure 2:
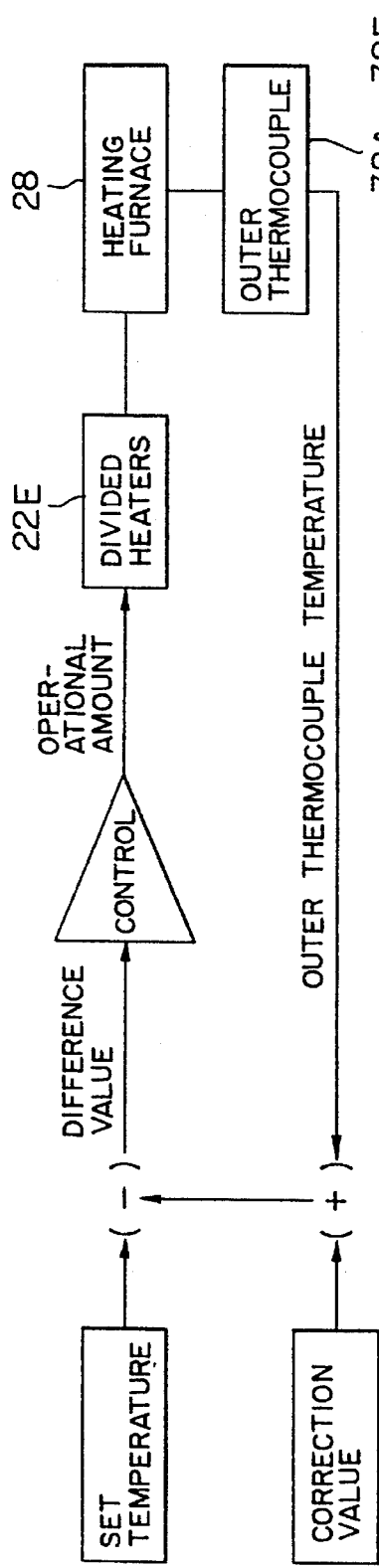
FIG. 2 is a block diagram of temperature control of the lowest heating zone of the heat treating apparatus of FIG. 1.

Wafer temperatures in the heating zones 30A–30D except the lowest heating zone 30E can be given by the following formula, and temperature control is conducted following the block diagram of the temperature control of FIG. 2. That is, Wafer temperature (Set temperature) =

Outer thermocouple temperature +

Correction value (Test thermocouple temperature −

Outer thermocouple temperature)

Figure 3:
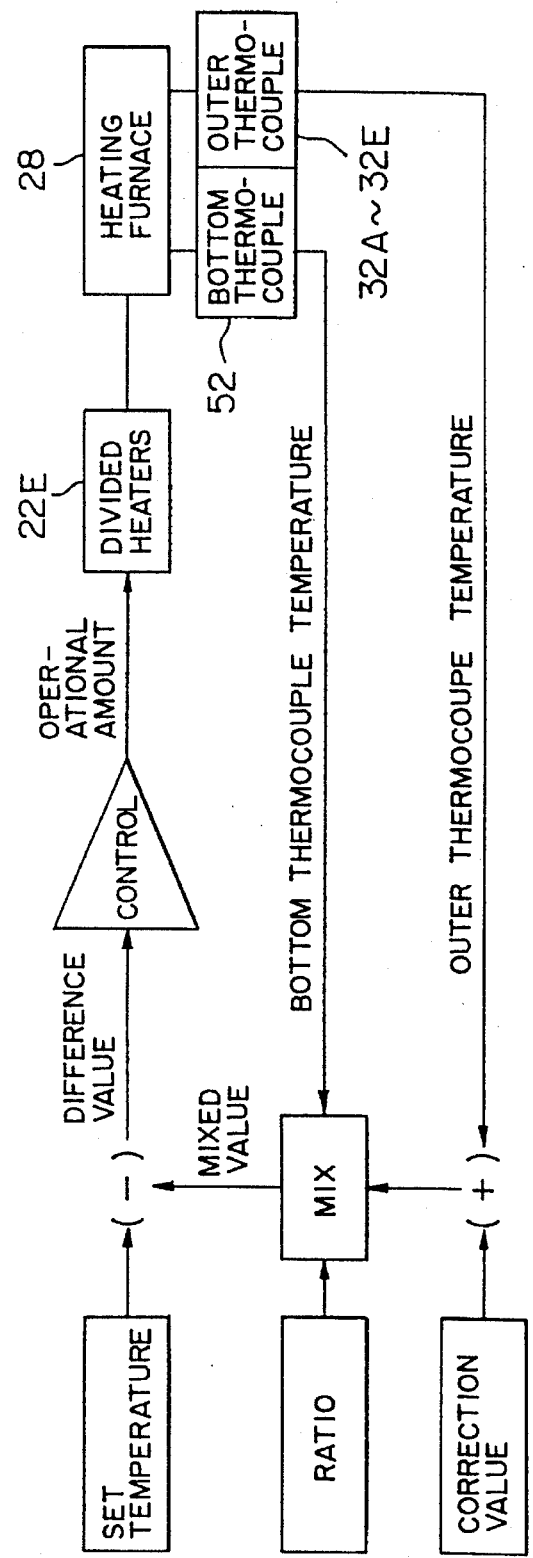
FIG. 3 is a block diagram of temperature control of the lowest heating zone of the heat treating apparatus of FIG. 1.

In the lowest heating zone 30E, based on detected values of both the outer thermocouple 32E and the bottom thermocouple 52, the temperature control is conducted following the block diagram of FIG. 3.

The heating furnace 28 in FIG. 1 is preheated by the heating unit 22 up to a relatively higher temperature, e.g., about 400° C., in a temperature range in which natural oxide films are difficult to be deposited on the wafers. Then the wafer boat 10 with a plurality of semiconductor wafers W mounted on at a certain pitch is loaded into the preheated processing vessel 8 by the elevator 12, and the open bottom end of the manifold 18 is closed by the cap to air-tightly close the processing vessel 8. Power of the heating unit 22 is increased to raise a temperature of the wafers W to a processing temperature, e.g., 850° C., and when the temperature is stabilized, a required processing gas is fed through the processing gas feed pipe 14. Then the interior of the processing vessel 8 is evacuated by a vacuum pump (not shown) down to a required pressure, e.g., about 0.5 Torr, and a heat treatment, e.g., a film deposition is conducted. The processing gas fed into the heating furnace ascends through the gap 54 between the heat insulating cylinder 2 and the inner tube 4 to the soaked wafer region. There an intended reaction product is formed, and films are deposited on the surfaces of the wafers. The processing gas which has ascended through the inner tube 4 makes a U-turn on the ceiling of the processing vessel 8 and flows inbetween the inner and the outer tubes 4, 6 to descend there, and is discharged out of the processing vessel through the gas exhaust pipe 16.

Temperatures inside the heating furnace are always detected by the respective thermocouples disposed in the heating furnace 28, and the detected temperatures are inputted to the control unit 62 through the bottom detector 60 and the outer thermocouple detectors 64, and based on a set temperature, the control unit 62 controls power of the heating unit 22 through the heat drive 66. This temperature control is conducted separately for the five respective heating zones 30A–30E. Accordingly the divided heater units 22A–22E are individually temperature controlled.

The temperature control for raising a temperature of 400° C. for the preheating to a processing temperature, 850° C. will be exemplified. Heat response in the heating zones 30A–30D upper of the lowest heating zone 30E which have relatively small heat capacities is better than in the lowest heating zone 30E and are temperature controlled following the block diagram of FIG. 3. That is, detected values of the respective heating zones 30A–30D by the associated outer thermocouples 32A–32D are combined with correction values preset for the respective heating zones 30A–30D, e.g., −5° C. (generally temperatures of the wafers are lower by about 5° C. than that of the heating unit), and corrected values and set wafer temperatures are compared with each other to give differential values. Then based on the differential values, new control inputs are given to control the associated divided heating units. The temperature control is conducted so that the differential values are zero.

Thus the heating zones 30A–30D except the lowest heating zone 30E have relatively small heat capacities, and good heat response can be obtained there. Accordingly the temperature control using only the outer thermocouples 32A–32D can quickly stabilize temperatures of the zones at a processing temperature without occurrences of overshoots, etc. in the heating zones. Temperature rise to a processing temperature, and stabilizing the processing temperature take short periods of time.

In the lowest heating zone 30E, not only a detected temperature value by the outer thermocouple 32E, but also a detected temperature value by the bottom thermocouple 52 are used for subtle temperature control. That is, a furnace temperature is controlled so that a mixed temperature of a detected temperature by the outer thermocouple and that of the bottom thermocouple at a set ratio agrees with a set temperature. Consequently an advantage of the outer thermocouple that good convergence to an intended temperature, and advantages of the inner disposed bottom thermocouple that good agreement to a set value and of good response of furnace temperature control to abrupt changes of internal temperatures are mixedly available, and temperature recovery at the time of loading wafers can be improved.

As shown in FIG. 3, a temperature value detected by the outer thermocouple 32 is combined with a correction value preset for this heating zone 30E, and a corrected value and a temperature value detected by the bottom thermocouple 52 are mixed at a set ratio to give a mixed value. Then the mixed value is compared with a set temperature to give a differential value. Based on this differential value, a new control input is given to control the divided heater unit 22E.

For example, immediately after wafers W of the room temperature are loaded into the processing vessel 8, a temperature sharply lowers. At this time, the lowest divided heating unit 22E is supplied with a little higher power than the other divided heating units, and when the temperature has risen to some extent, the power is so set that the usual temperature rise rate is available for the prevention of overshoots.

A period of time in which the whole heating furnace temperature is stabilized is controlled at a rate for stabilizing a temperature of the side of the lowest heating zone having a relatively large heat capacity. But only the lowest heating zone 30E having a relatively large heat capacity is temperature controlled, based on detected values by the inner disposed bottom thermocouple 52, and the outer thermocouple 32E, and a period of time of temperature rise and stabilization there can be much shortened. Consequently a period of time necessary to stabilize the whole heating furnace at a temperature can be further shortened, heat recovery is improved, and throughputs can be further improved.

As shown in FIG. 1, because the bottom thermocouple 52 of the temperature detecting sensor 46 is disposed in the film depositing area 44 at the bottom of the interior of the processing vessel, thermoresponse is improved, and temperatures in the film depositing area where a temperature is raised to cause chemical reactions necessary for an intended film can be accurately and quickly measured, whereby the film can be deposited. Consequently a period of time required to raise a temperature and stabilize the temperature can be further shortened, heat recovery can be improved, and higher throughputs can be obtained.

The mount portion 51 of the sensor glass tube 50 housing the bottom thermocouple 52 is supported in a side of a lower part of the manifold 18 in the film non-depositing area 59 which is upstream of the processing gas flow and in which substantially no reaction products and reaction by-products are formed because of lower temperatures. Because substantially no reaction stay on the mount portion, the sensor glass tube 50 can be easily put on and off. Maintenance operations, as of removing films staying on the sensor glass tube, and washing the sensor glass tube can be made quickly. A number of wires for the thermocouple is as small as one, which makes washing easy.

Because the sensor glass tube 50 is provided inside the inner tube 4, the sensor glass tube 50 can be removed without removing the inner tube, as cannot in the prior art apparatus. A number of thermocouples included in the apparatus can be greatly decreased, which contributes to lowering costs.

In the method for the temperature control in the lowest heating zone 30E of the above-described embodiment, temperatures detected by two thermocouples are mixed at a set rate. But the method is not essentially limited to this method. For example, a cascade control method may be used in which first a set temperature, and a detected temperature by the inner disposed bottom thermocouple 52 are compared to give a differential value, then this differential value is combined with the set value to give a new set temperature, and control is conducted to agree the new set value with a detected temperature by the outer thermocouple 32E.

In the above-described embodiment the heating zone is unessentially divided in five zones, and may be divided in less or more zones.

In the above-described embodiment the rotary wafer boat 10 is rotatable, but may not be rotatable.

Second Embodiment

A vertical heat treating apparatus for semiconductor wafers using the heat treating apparatus according to a second embodiment of the present invention will be explained with reference to the drawings.

Figure 4:
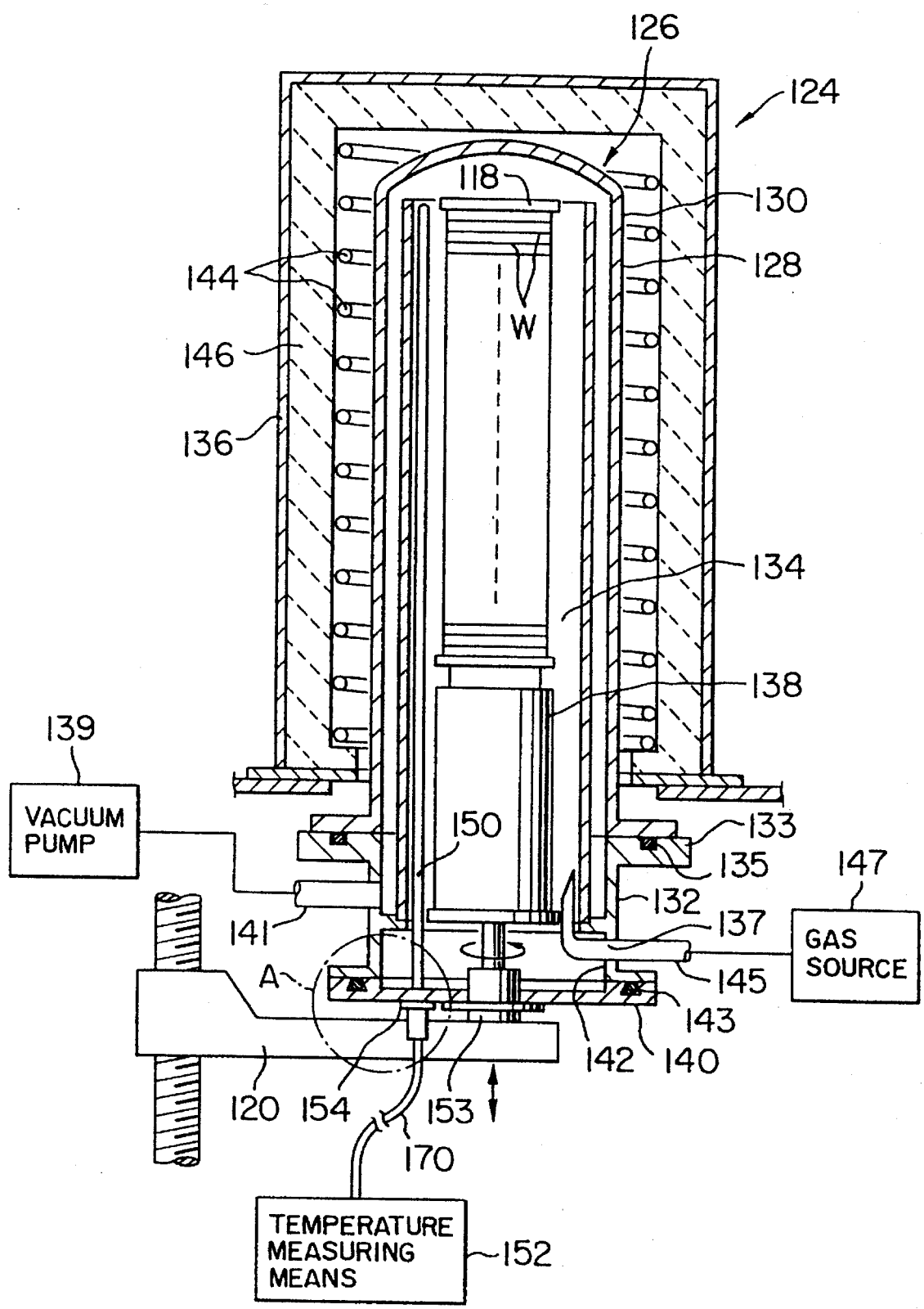
FIG. 4 is a vertical sectional view of the heat treating apparatus according to a second embodiment of the present invention.

FIG. 4 is a vertical sectional view of the vertical heat treating apparatus according to the second embodiment including a thermocouple tube (T/C tube).

As shown in FIG. 4, a heat treatment furnace 124 of the heat treating apparatus according to the second embodiment comprises a processing vessel 126 and a heating unit. The processing vessel 126 comprises a manifold 132, and a double structure including a cylindrical outer tube 128 of, e.g., quartz and having the upper end closed and the lower end opened and a cylindrical inner tube 130 of quartz disposed in the outer tube 128 conically therewith and having the upper and the lower end opened. The inner tube 130 is to accommodate a wafer boat with a plurality of semiconductor wafers W mounted on. The wafer boat is also formed of quartz.

A resistance heater 144, for example, is disposed around the outer circumference of the outer tube 128 conically therewith. A cylindrical outer shell 136 of, e.g., stainless steel is disposed around the outer circumference of the heater 144 through a heat insulating material 146. Thus the heating furnace 124 is constituted. The interior of the processing vessel 126 can be suitably set at a temperature of, e.g., a 300°–1200° C. heat treatment temperature range by controlling the heater 144 based on a preset processing program.

The cylindrical manifold 132 of, e.g., stainless steel is connected to the lower end of the outer tube 128. An annular flange is formed on the upper end of the manifold 132. An O-ring 135 as a seal member is placed in an annular groove formed in the flange 133 for air-tightly sealing a gap between the outer tube 128 and the manifold 132. The manifold 132 bears the lower end of the inner tube 130. A gas feed pipe 137 is connected to a lower side of the manifold 132, and to an opposite upper side thereof is connected a gas exhaust pipe 141 which is connected to an outside vacuum pump 139, so that a reaction gas is introduced into the processing vessel 126 after the interior of the processing vessel 126 has been evacuated.

The wafer boat 118 is mounted on the top of the heat insulating cylinder 138 of, e.g., quartz. The heat insulating cylinder 138 is rotatably supported by a cap 140 of, e.g., stainless steel. The cap 140 air-tightly closes the opening in the bottom of the manifold 132 through an O-ring 143. The cap 140 is mounted on a boat elevator 120 so that load and unload the wafer boat 118 into and out of the processing vessel 126. The wafer boat 118 and the heat insulating cylinder 138 are rotated at a set speed by a rotary drive mechanism 153 provided on the cap 140.

The gas feed pipe 137 is formed of an L-shaped pipe of quartz and is connected to an outside gas pipe 145 of, e.g., stainless steel through a through-hole in the manifold 132. The gas pipe 145 is connected to an outside gas source 147. e.g., a CVD gas feed source.

The heater 144 uses the five-zone system by which a processing interior 134 of the processing vessel 126 is latitudinally divided in five zones, and the respective five zones are individually heated under their suitable temperature conditions.

Then the T/C tube and a T/C support mechanism used in the heat treating apparatus according to the second embodiment of the present invention will be explained.

Figure 5:
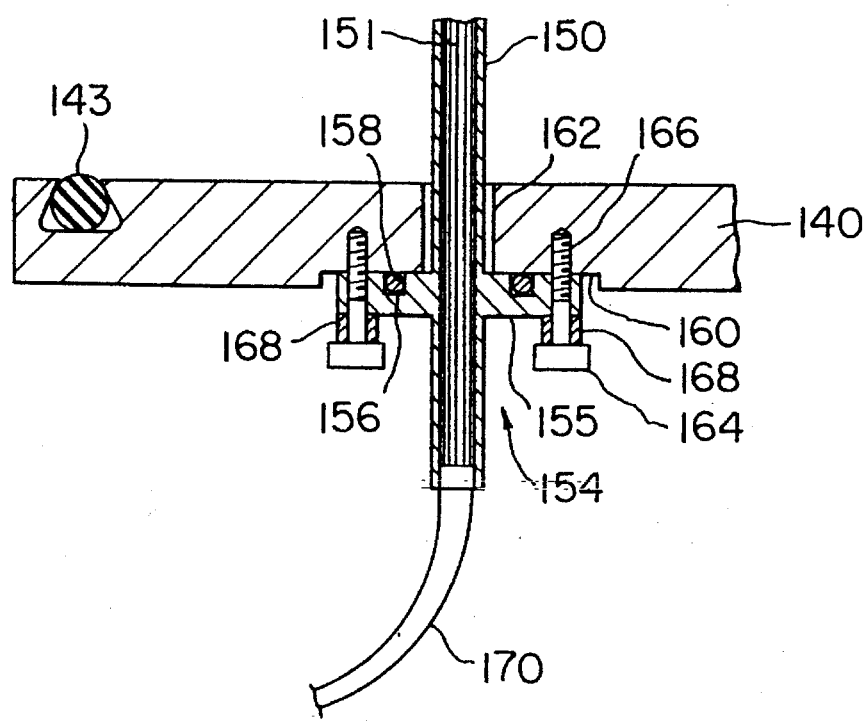
FIG. 5 is a partially enlarged vertical sectional view of a support mechanism (indicated by the arrow A in FIG. 4) for a thermocouple tube of the heat treating apparatus of FIG. 4.

As shown in FIG. 5, the T/C tube 150 is formed of quartz and accommodates five thermocouples 151 which cover the five heating zones so that film depositing temperatures can be correctly detected corresponding to the five zones of the heater 144. Wires of the respective thermocouples are connected to outside temperature measuring means 152 (see FIG. 4) so that respective heater of the five zones as in FIG. 1 are feed-back controlled. This feed-back system is connected to an automatic control system by a computer not shown.

As shown in FIG. 5, a flange 155 is formed on a lower part of the T/C tube 150. An annular groove 156 is formed in the upper surface of the flange 155. An O-ring 158 is placed in the annular groove 156. A circular recess 160 is formed in the underside of the cap 140 at a position where the circular recess 160 does not hinder a direction of movement of transfer means for transfer of wafers. A through-hole 162 is formed in the recess 160. The T/C tube 150 is passed through the through-hole 162 so that the upper surface of the flange 154 is in close contact with the underside of the recess 160, whereby the T/C tube 150 is erected vertically to the cap 140. A plurality of set screws 164 are screw-engaged in female screws in the flange 140 through a plurality of holes formed in the flange 155, whereby the T/C tube 150 can be removably secured to the cap 140. Thus the support mechanism 154 for the T/C tube 150 is constituted.

The set screws 164 can be fastened with a hand with Teflon washers 168 disposed between the knurled screw heads and the undersides of the flanges 154. The lower ends of the five thermocouples inserted in the T/C tubes 150 are bundled in a cable 170 which is connected to the temperature measuring means 152 outside the processing vessel.

The support mechanism of this structure for the T/C tube 150 can enable the T/C tube 150 to be securely put through the cap 140 very accurately vertically thereto by the flange 154. In addition, the fastening can be done very easily with a hand and the unfastening can be done in a short period of time.

Next, a variation of the T/C tube and the T/C support mechanism included in the second embodiment of the present invention will be explained.

Figure 6:
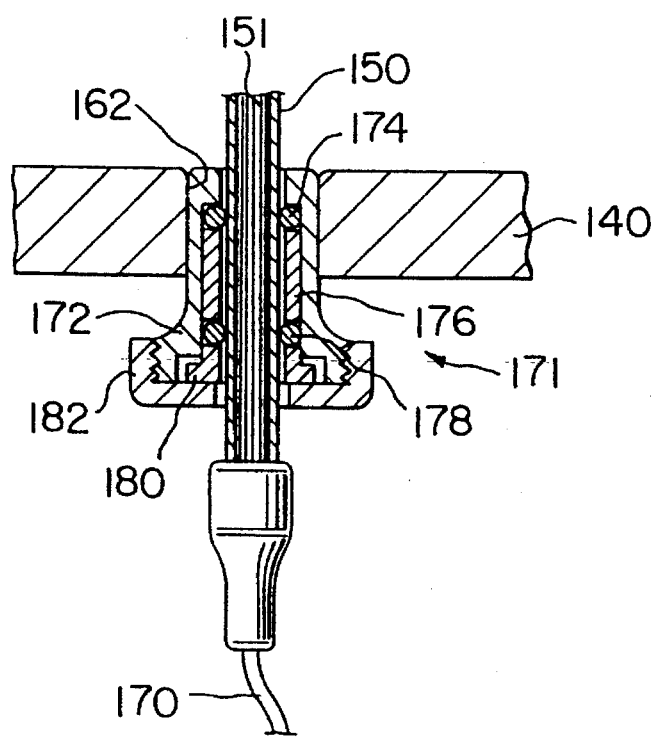
FIG. 6 is a partially enlarged vertical sectional view of a variation of the support mechanism for the thermocouple tube of FIG. 5.

As shown in FIG. 6, in this variation, a metal guide member 172 is applied by welding or other means to the inside of the through-hole 162 formed in the cap 140, and a bore of the guide member 172 has a set length. The T/C tube 150 is supported vertically to the cap 140 at two points by a first O-ring 174 disposed on the upper end of the bore, and a second O-ring 178 vertically spaced by a set distance from the first O-ring 174 through a Teflon washer 176.

The second O-ring 178 is fixedly supported by a cap screw 182 through a presser washer. When the cap screw 182 is turned, the presser washer 180 ascends to crush the first and the second O-rings 174, 178 by the guide member 172, the Teflon washer 176 and the presser washer 180, whereby the T/C tube 150 is resiliently fixedly held. Thus the support mechanism 171 for the T/C tube 150 according to a variation of the embodiment is constituted The five thermocouples inserted in the T/C tube 150 have the lower end portions bundled in a cable 170 which is connected to the outside temperature measuring means 152.

By the support mechanism for the T/C tube according to a variation of the second embodiment, the T/C tube 150 can be put through the cap 140 very accurately vertically thereto by a press-holding force of the two O-rings 174, 178. In addition, the fastening can be done by fastening the cap screw 182 with a hand. The fastening is very easy and can be removed for a very short period of time.

By erecting the T/C tube with respect to the cap 140 as described above, the T/C tube 150 can be supported, in a heat treatment, closely beside the wafer boat 118. Temperatures which are most approximate to temperatures objects under the heat treatment are exposed to can be accurately measured real time.

Then CVD process in the heat treatment furnace of the heat treating apparatus according to the second embodiment will be explained with reference to FIG. 4.

The wafer boat 118 holding a plurality of semiconductor wafers W horizontally at a set pitch from each other is loaded into the processing vessel 126 by the boat elevator 120, and the opening of the manifold 132 is closed by the cap 140 to air-tightly close the processing vessel 126. A set mount of a processing gas, e.g., TEOS is fed through the gas feed pipe 137 while the interior of the processing vessel 126 is evacuated by the vacuum pump 139 through the exhaust pipe 141 to set the interior of the processing vessel at a required pressure, e.g., 1 Tort. Furthermore, with the interior of the processing vessel 126 set at a required temperature, e.g., 700° C. by the heater 144, about 100 cc/min of the above-described TEOS is fed to deposit films for a required period of time.

During film deposition, the wafer boat 118 is set on rotation at a set speed to rotate the semiconductor wafers W. In film deposition, the processing gas introduced through the gas feed pipe 137 is rectified when released from the forward end of the gas feed pipe 137 into the processing vessel 126 and ascend in a laminar flow, while a part of the processing gas flows also to the side of the semiconductor wafers W. Thus required homogeneous films are deposited on the entire surfaces of the semiconductor wafers.

In the second embodiment of the present invention, in depositing films, the T/C tube 150 is held vertical near the wafer boat 118 to measure temperatures near the wafers under the film deposition. Based on detected temperatures, the heater 144 can be feed-back controlled, whereby the interior of the heat treatment furnace can have a uniform temperature during the film deposition.

While film depositing process is repeated, films are deposited also on the outside of the T/C tube with the result that its heat conduction is deteriorated. It is necessary to periodically wash the T/C tube. But, according to the present invention, because the T/C tube can be very easily put through the cap, the T/C tube can be removed or replaced for washing for a short period of time.

Thus, the present invention has been explained by embodiments in which the present invention is applied to CVD apparatuses for semiconductor wafers. But the present invention is not limited to these embodiments and can cover various modifications and variations within the scope of the present invention. For example, the present invention can be applied to oxidation furnaces, diffusion furnaces, etching apparatuses, ashing apparatuses, CVD apparatuses for LCD substrates, etc.

What is claimed is:

1. A heat treating apparatus for heat treating objects-to-be-treated, comprising:

a processing vessel having an upper part, a middle part and a lower part, and a processing chamber for receiving loaded objects-to-be treated;

an object-to-be-treated boat mounted on a heat insulating cylinder, and a heating device for providing a heat treatment to the objects to be treated, and said heating device being divided into a plurality of zones, the apparatus further comprising;

an interior temperature detecting sensor for detecting a heating temperature of the lower part of the processing vessel and for facilitating controlling of the heating temperature of the lower part of the interior of the processing vessel which lower part has a relatively large heat capacity and which is a film depositing area where films stay during heat treatment processing, and said interior temperature detecting sensor being fixed at the lower part of the processing vessel.

2. The heat treating apparatus according to claim 1, wherein the processing vessel comprises an inner tube having a larger diameter than the heat insulating cylinder, and an outer tube concentrically disposed with the inner tube and having a larger diameter than the inner tube, the film depositing area is a gap between the heat insulating cylinder and the inner tube and said interior temperature detecting sensor being positioned within said gap.

3. The heat treating apparatus according to claim 1, wherein a mount portion of the temperature detecting sensor is supported in a film non-depositing area which is upstream of a processing gas flow path formed in said apparatus for processing, has a lower temperature during processing than the objects-to-be-treated, and has substantially no reaction products and reaction by products formed thereon during processing.

4. The heat treating apparatus according to claim 1, wherein the film depositing area is between substantially ⅔ a height of the heat insulating cylinder and a third tier of said boat which supports a third sheet to the objects-to-be-treated and is located upward from a lowest tier of said boat.

5. A heat treating apparatus comprising:

a processing vessel for heat treating objects to be treated;

an object-to-be-treated boat for holding the objects to be treated in the processing vessel;

a cap for holding the object-to-be-treated boat and airtightly closing an opening of the processing vessel;

temperature measuring means for measuring temperatures in the processing vessel;

a quartz tube housing the temperature measuring means being passed through a hole formed in the cap and removably fixed in the processing vessel; and support means for supporting said quartz tube housing the temperature measuring means and for retaining the interior of the processing vessel air-tight, said support means being provided on the cap.

6. The treating apparatus according to claim 5, wherein the support means is a flange provided on a base portion of the quartz tube.

7. The heat treating apparatus according to claim 5, wherein the support means is double O-rings for longitudinally holding a base portion of the quartz tube.

8. The heat treating apparatus according to claim wherein a rotary drive mechanism for turning the object-to-be-treated boat in the processing vessel is provided on the cap.

9. A heat treating apparatus for objects-to-be-treated, comprising:

an outer shell having an internal cavity;

an insulating layer positioned within said internal cavity;

a processing vessel positioned within the internal cavity of said shell and having an upper part, a middle part and a lower part which together define a processing chamber, and said processing vessel having an opening for receiving objects-to-be-treated in the processing chamber;

a heating apparatus also positioned within said internal cavity and external to said processing chamber, said heating apparatus having a plurality of heating zones;

a heat drive unit which individually drives said heating zones;

a boat for supporting the objects-to-be-treated;

a boat support which supports said boat;

loading and sealing means for loading and unloading said boat and boat support and for sealing said opening in said processing vessel;

a first set of temperature sensors for detecting the temperature of respective ones of said plurality of heating zones, which zones are arranged along the upper, middle and lower parts of said processing vessel, said first set of temperature sensors being positioned externally with respect to said processing chamber;

an interior temperature sensor fixed in position within said processing vessel at the lower part of said processing vessel which lower part has a relatively large heat capacity as compared with said middle and upper parts; and a control unit which is in communication with said first set of temperature sensors and said interior temperature sensor for receiving sensed temperature values from said first set of temperature sensors and said interior temperature sensor, and said control unit being further in communication with said heat drive unit for controlling temperatures of said heating zones based on said sensed temperature values.

10. An apparatus as recited in claim 9 wherein said boat support includes a heat insulating cylinder positioned below said boat and said processing vessel further comprises an inner cylinder which is sized for receiving therein said boat and boat support, and said interior temperature sensor being fixed in position within a gap formed between said inner cylinder and said heat insulating cylinder.

11. An apparatus as recited in claim 10 further comprising a manifold sandwiched between said processing vessel and said loading and sealing means, said manifold including a process gas inlet port and said inner temperature sensor having a tube member with a mount end supported by said manifold at a location upstream of a film depositing area adjacent an upper portion of said heat insulating cylinder, and said tube member extending within a process gas passageway formed between said boat support and said inner cylinder, and said tube member including a free end positioned within said film depositing area.

12. An apparatus as recited in claim 11 wherein said heat insulating cylinder is formed of quartz.

13. An apparatus as recited in claim 11 wherein the free end of said tube member falls between a third tier object support of said boat and a level ⅔ up from a bottom of said heat insulating cylinder.

14. An apparatus as recited in claim 9 wherein said control unit includes a first correction value feature which adds to temperature values sensed by said first set of temperature sensors in said middle and upper parts of said processing chamber to compensate for a more outward location of said first set of temperature sensors with respect to the objects-to-be-treated, and said control unit including a second correction value feature which is based on a comparison of a temperature reading of one of said first set of temperature sensors located in said lower part of said processing vessel and also a temperature reading of said interior temperature sensor and is relied upon by said heat driver unit to reach a desired temperature in said lower part.

15. A heat treating apparatus as recited in claim 1 further comprising an outer set of temperature detecting sensors positioned radially outward of said interior temperature detecting sensor, and said outer set of temperature detecting sensors being positioned for monitoring temperatures within the lower, middle and upper parts of said processing vessel, and said outer set of temperature sensor being positioned externally with respect to said processing vessel.

16. A heat treating apparatus as recited in claim 15 further comprising a control unit in communication with both said interior temperature detecting sensor and said outer set of temperature detecting sensors, and said control unit further being in communication with a heat driver which individually drives heater elements within said heater zones.

17. A heat treating apparatus as recited in claim 16 wherein said control unit includes a first correction value feature which adds to temperature values sensed by said outer set of temperature detecting sensors to compensate for a more outward location with respect to the objects-to-be-treated, and said control unit further including a second correction value feature for making corrections in sensed temperature values in said lower part based upon a comparison of a temperature reading of one of said outer temperature sensors located in said lower part and a temperature reading of said interior temperature detecting sensor.

18. A heat treating apparatus as recited in claim 1 further comprising a manifold which is positioned between said cap and the lower part of said processing vessel, and said manifold having a process gas inlet and a support through-hole dimensioned for receiving a mounting end of said interior temperature detecting sensor, and said processing vessel comprising an outer processing vessel tube having an open bottom end supported by said manifold and a closed top end and an inner heat equalization tube positioned within said outer tube and having an open bottom end supported by said manifold and an open upper end positioned below the closed top end of said outer tube, and said interior temperature detecting sensor being positioned radially inward of said inner heat equalization tube and said process gas inlet being positioned such that a flow of process gas travels upwardly within said inner heat equalization tube, past said interior temperature detecting sensor, and out of the open end of said inner heat equalization tube and then within a passageway formed between the exterior of the inner heat equalization tube and the interior of said outer tube.

19. A heat treating apparatus as recited in claim 18 further comprising an outer set of temperature sensors which are positioned so as to not come in contact with the flow of process gas.

\* \* \* \* \*